United States Patent
Itakura et al.

(10) Patent No.: US 10,916,912 B2
(45) Date of Patent: Feb. 9, 2021

(54) OPTICAL MODULE

(71) Applicant: Mitsubishi Electric Corporation, Tokyo (JP)

(72) Inventors: Hiroshi Itakura, Tokyo (JP); Keitaro Yamagishi, Tokyo (JP); Yoshihiro Akeboshi, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/470,614

(22) PCT Filed: Jan. 20, 2017

(86) PCT No.: PCT/JP2017/001928
§ 371 (c)(1),
(2) Date: Jun. 18, 2019

(87) PCT Pub. No.: WO2018/134967
PCT Pub. Date: Jul. 26, 2018

(65) Prior Publication Data
US 2019/0334313 A1    Oct. 31, 2019

(51) Int. Cl.
H01S 5/022       (2006.01)
G02B 6/42        (2006.01)
H01L 23/31       (2006.01)
H01L 31/0203     (2014.01)
H01S 5/0683      (2006.01)
H05K 1/18        (2006.01)

(52) U.S. Cl.
CPC ........ H01S 5/02212 (2013.01); G02B 6/4201 (2013.01); H01L 23/3114 (2013.01); H01L 31/0203 (2013.01); H01S 5/02248 (2013.01); H01S 5/0683 (2013.01); H05K 1/189 (2013.01)

(58) Field of Classification Search
CPC ............. H01S 5/02212; H01S 5/02248; H01S 5/0683; G02B 6/4201; H01L 31/0203; H01L 23/3114; H05K 1/189
See application file for complete search history.

(56) References Cited

U.S. PATENT DOCUMENTS

2006/0164817 A1* 7/2006 Yoshida .............. H01L 31/0203
                                                    361/749
2010/0006863 A1   1/2010 Ban et al.

FOREIGN PATENT DOCUMENTS

JP    2000-353850    * 12/2000
JP    2000-353850 A   12/2000
(Continued)

OTHER PUBLICATIONS

International Search Report, issued in PCT/JP2017/001928, PCT/ISA/210, dated Apr. 4, 2017.
(Continued)

Primary Examiner — Armando Rodriguez
(74) Attorney, Agent, or Firm — Birch, Stewart, Kolasch & Birch, LLP

(57) ABSTRACT

There are included a CAN package (2) having a stem (22) and lead pins (23a and 23b) protruding from the stem (22), and a board (3) having pads (33a and 33b) for connecting lead pin. The CAN package (2) has a slot (222) provided in a surface of the stem (22) from which the lead pins (23a and 23b) protrude. One end of the board (3) is inserted into the slot (222), and the pads (33a and 33b) for connecting lead pin are electrically connected to the lead pins (23a and 23b).

5 Claims, 14 Drawing Sheets

(56) References Cited

FOREIGN PATENT DOCUMENTS

| JP | 2003-332667 | * | 11/2003 |
| JP | 2003-332667 A | | 11/2003 |
| JP | 2004-207259 A | | 7/2004 |
| JP | 2004-356380 A | | 12/2004 |
| JP | 2005-19717 A | | 1/2005 |
| JP | 2009-302438 A | | 12/2009 |
| JP | 2013-92689 A | | 5/2013 |

OTHER PUBLICATIONS

Office Action issued in Japanese Patent Application No. 2017-536910 dated Sep. 5, 2017.
Chinese Office Action issued in corresponding Chinese Patent Application No. 201780083285.1 dated Aug. 21, 2020.

* cited by examiner

OPTICAL MODULE

TECHNICAL FIELD

The invention relates to an optical module including a CAN package having a stem and a lead pin; and a board having an electrode connected to the lead pin, and relates to the CAN package.

BACKGROUND ART

In optical communication, an optical module that transmits and receives optical signals plays a key role. The optical module includes a CAN type optical package (hereinafter, CAN package) and a flexible board. In the CAN package, a board having mounted thereon an LD chip (photoelectric conversion element), such as a laser (optical transmitting element) and a photodiode (optical receiving element), is included in a lens housing. In addition, the flexible board corresponds to a mounting board of the optical module. The optical module is often used in an optical transceiver that supports a transmission rate approximately several 100 Mbps to 10 Gbps.

The CAN package is connected to the flexible board, and the flexible board is connected to another printed board having a driver IC mounted thereon.

Here, when the CAN package is connected to the flexible board, for example, as shown in FIG. 14, a user first passes lead pins 1023 protruding from the back side of a CAN package 102, through through-holes 1031 provided in advance in a flexible board 103. Then, the user performs, for example, soldering on the through-holes 1031, by which the lead pins 1023 are fixed to the flexible board 103. Note that the lead pins 1023 are generally terminals for a ground, for power supply, or for electrical signals in many cases. In the above-described connection method, since the lead pins 1023 are inserted into the through-holes 1031 of the flexible board 103, the connection is strong, and thus it is unsusceptible to stress caused by changes in temperature and humidity and mechanical pressure. Thus, reliability of a product is high. Note that in FIG. 14, reference sign 101 indicates an optical module, reference sign 1021 indicates a lens housing, and reference sign 1022 indicates a stem.

On the other hand, in the above-described connection method, it is known that an impedance mismatch inevitably occurs at a connecting portion between the CAN package and the flexible board. The impedance mismatch will be described below.

An optical module is generally used by connecting, by a user, a flexible board to a CAN package which is provided by various manufacturers. Thus, to facilitate user's connecting work, basically, the lead pins of the CAN package have a length with some extra length. Hence, the user inserts the lead pins of the CAN package into the through-holes of the flexible board, and then manually cuts off a portion of each lead pin jutting out of the through-hole. Upon this, there is always a remaining portion of a lead pin after cutting off the lead pin, and the remaining portion becomes a stub that degrades high-frequency characteristics. A frequency band influenced by the stub depends on the length of the remaining portion of the lead pin, which indicates that the characteristics of the optical module vary depending on user's technical capabilities. Thus, depending on the user, an adverse effect may be exerted on the reliability of the optical module itself.

In addition, a surface of the stem of the CAN package and a surface of the flexible board face each other. Hence, unless the stem and a ground conductor included in the flexible board are connected to each other without a gap therebetween, parallel plate resonance occurs in a frequency band that depends on the gap therebetween, which significantly degrades high-frequency transmission characteristics. A frequency band in which this problem occurs is likely to exert an adverse effect on 25 to 100 Gbps transmission which is expected to be used in the future in the business field of optical modules.

There is known a configuration for overcoming an impedance mismatch such as that described above (see, for example, Patent Literature 1). In the configuration disclosed in Patent Literature 1, variation in characteristic impedance is suppressed by bringing a flexible board into parallel contact with a lead pin.

CITATION LIST

Patent Literature

Patent Literature 1: JP 2004-207259 A

SUMMARY OF INVENTION

Technical Problem

However, in the configuration disclosed in Patent Literature 1, the flexible board is joined and fixed to the stem. Hence, there is a problem in which the connection between the CAN package and the flexible board is weak, and thus, it is susceptible to stress caused by changes in temperature and humidity and mechanical pressure, and thus, reliability of a product is low.

The invention is made to solve problems such as that described above, and an object of the invention is to provide an optical module that has high reliability of a product and can overcome an impedance mismatch at a connecting portion between a CAN package and a board.

Solution to Problem

An optical module according to the invention includes a CAN package having a stem and a lead pin protruded from the stem; and a board having an electrode. The CAN package has a slot provided in a surface of the stem, the lead pin being protruded from the surface, and the slot being provided in the surface except for a part from which the lead pin protrudes. One end of the board is inserted into the slot, and the electrode is electrically connected to the lead pin. The stem also functions as a ground conductor. The board has a ground conductor exposed to outside at the one end and electrically connected to the stem.

Advantageous Effects of Invention

According to the invention, since it is configured in the above-described manner, reliability of a product is high, and an impedance mismatch at a connecting portion between a CAN package and a board can be overcome.

BRIEF DESCRIPTION OF DRAWINGS

FIG. 1A is a top perspective view, and FIG. 1B is a bottom perspective view.

FIG. 2A is a front view, and FIG. 2B is a side view.

FIG. 3A is a side view, FIG. 3B is a front side view, and FIG. 3C is a back side view.

FIG. 4A is a front side view, and FIG. 4B is a back side view.

FIG. 13A is a side view, and FIG. 13B is a front side view.

DESCRIPTION OF EMBODIMENTS

Embodiments of the invention will be described in detail below with reference to the drawings.

First Embodiment

Figure 1A:
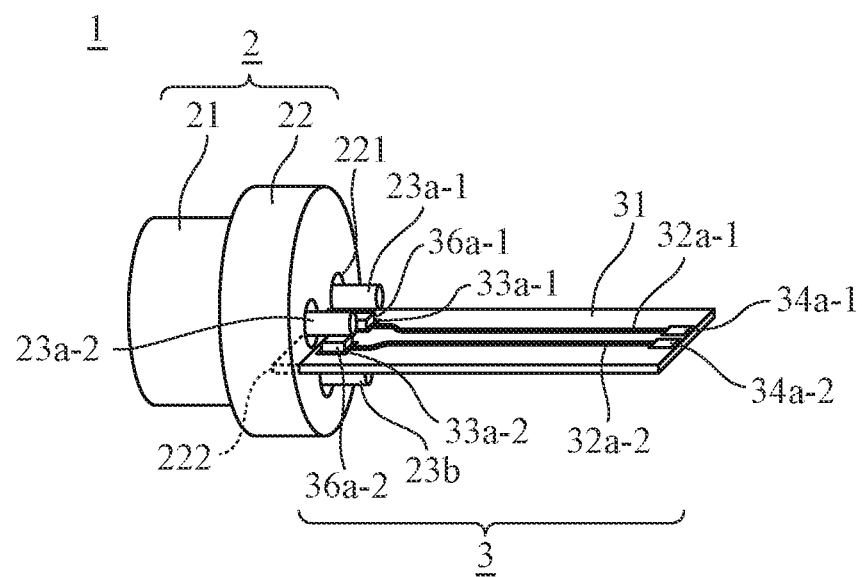
FIGS. 1A and 1B are diagrams showing an exemplary configuration of an optical module according to a first embodiment of the invention.
Figure 1B:
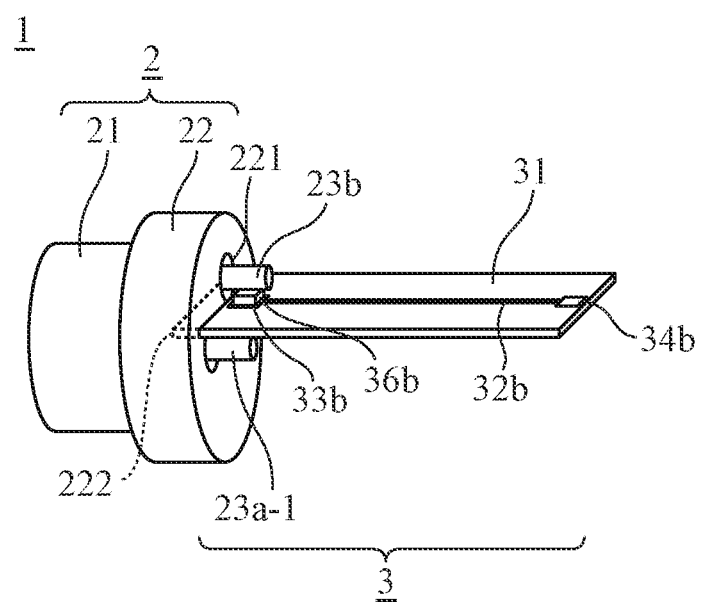

FIG. 1 is a diagram showing an exemplary configuration of an optical module 1 according to a first embodiment of the invention.

The optical module 1 transmits and receives optical signals. The optical module 1 includes, as shown in FIG. 1, a CAN package 2 and a board 3.

Figure 2A:
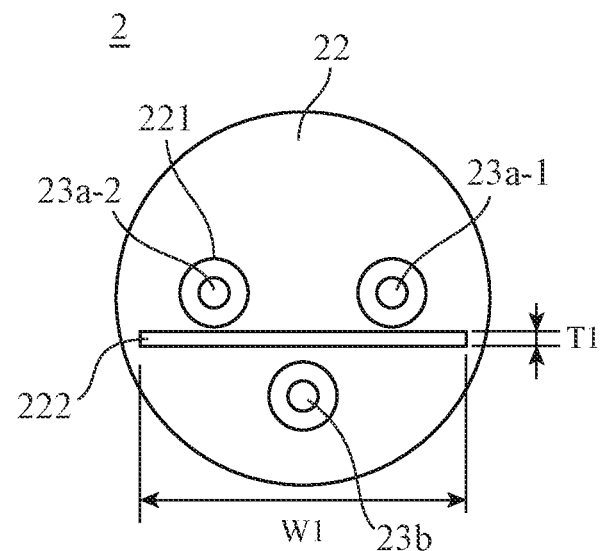
FIGS. 2A and 2B are diagrams showing an exemplary configuration of a CAN package according to the first embodiment of the invention.
Figure 2B:
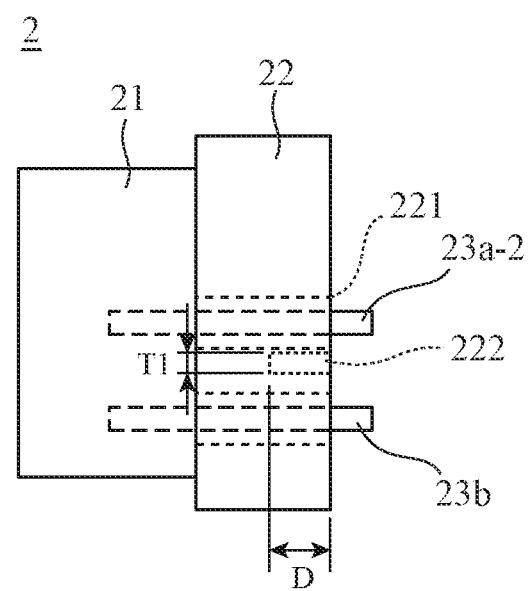

The CAN package 2 has, as shown in FIG. 2, a lens housing 21, a stem 22, and lead pins 23a and 23b.

The lens housing 21 includes therein a board (not shown) having an LD chip mounted thereon, etc.

The stem 22 is a heat dissipating member that dissipates heat from the lens housing 21. In addition, the stem 22 also functions as a ground conductor of the CAN package 2. The stem 22 is provided with through-holes 221 in an axial direction. In an example of FIG. 2, three through-holes 221 are provided.

The lead pins (first lead pins) 23a are lead pins that transmit electrical signals, and one end of each lead pin 23a is electrically connected to the board included in the lens housing 21 through the corresponding through-hole 221 of the stem 22, and the other end protrudes from the stem 22. FIG. 1 shows a case in which a differential transmission system is adopted as a transmission system of electrical signals. Two lead pins 23a-1 and 23a-2 are provided as the lead pins 23a, and digital signals having a phase difference of 180° are inputted and outputted to/from the respective lead pins 23a-1 and 23a-2.

The lead pin (second lead pin) 23b is a lead pin that transmits power, and one end of the lead pin 23b is electrically connected to the board included in the lens housing 21 through the corresponding through-hole 221 of the stem 22, and the other end protrudes from the stem 22.

These lead pins 23a and 23b access the board included in the lens housing 21 through the through-holes 221 provided in the stem 22. Thereafter, the through-holes 221 are sealed with a resin such as glass, by which the lead pins 23a and 23b are fixed.

In addition, in the CAN package 2 according to the first embodiment, a slot 222 is provided in a surface of the stem 22. The lead pins 23a and 23b protrude from the surface. A side cross-section shape of the slot 222 is, for example, a rectangular shape or a U-shape.

Figure 3A:
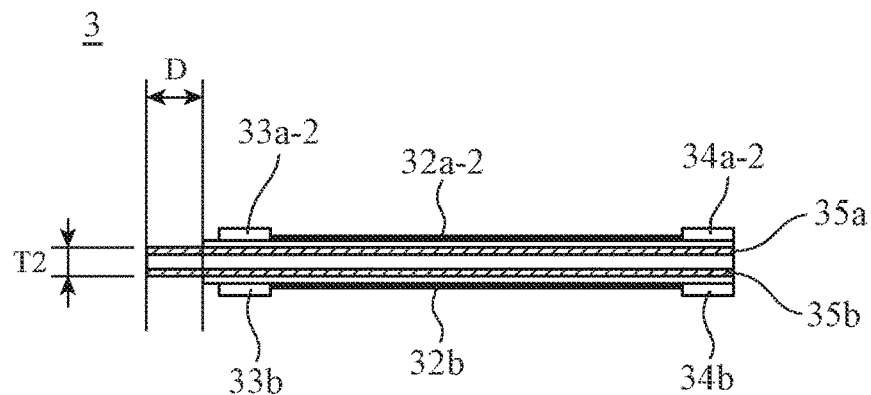
FIGS. 3A to 3C are diagrams showing an exemplary configuration of a board according to the first embodiment of the invention.
Figure 3B:
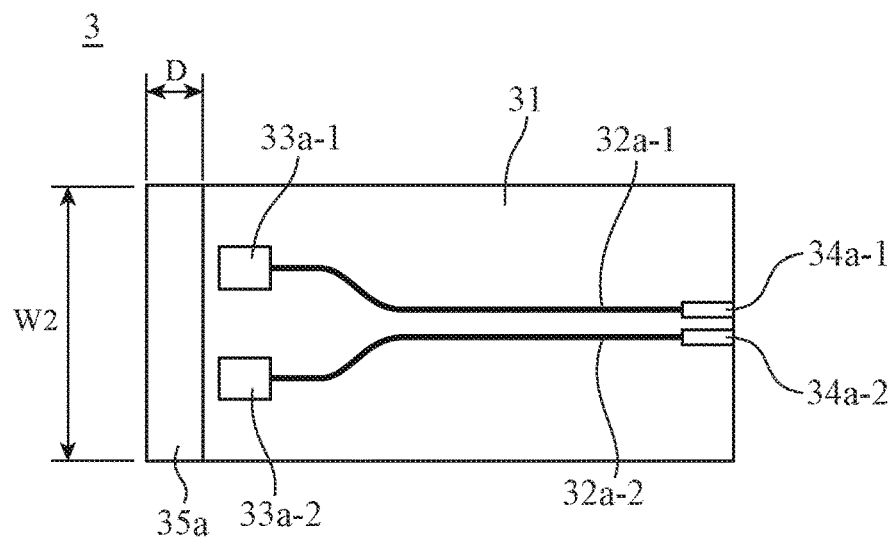
Figure 3C:
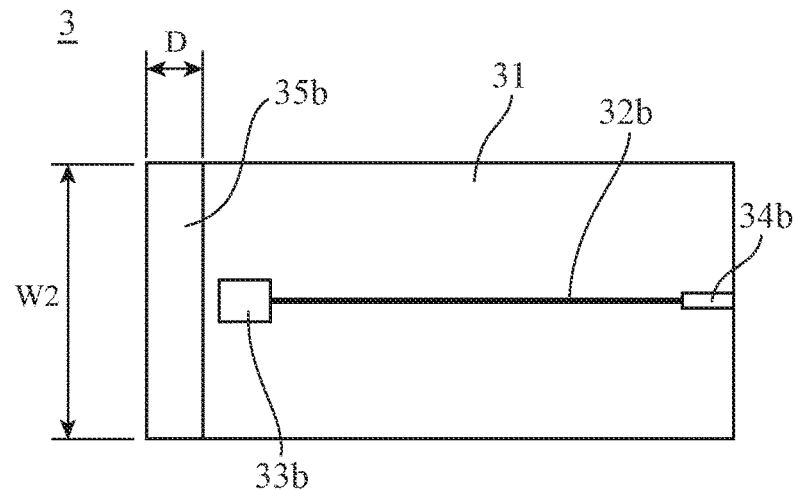

The board 3 corresponds to a mounting board of the optical module 1, and is a general circuit board formed of a resin 31. Note that the board 3 may be a flexible board or may be any other printed board. The board 3 has, as shown in FIG. 3, signal wiring lines 32a, a wiring line 32b for power supply, pads 33a and 33b for connecting lead pin, pads 34a and 34b for connecting another board, and ground conductors 35a and 35b. Note that FIG. 3 shows a case in which the board 3 is formed of a multilayer structure of four layers.

The signal wiring lines 32a are provided on a front layer of the board 3. In FIG. 3, differential signal wiring lines 32a-1 and 32a-2 are provided as the signal wiring lines 32a.

The wiring line 32b for power supply is provided on a back layer of the board 3.

The pads 33a for connecting lead pin (first pads for connecting lead pin) are electrodes each provided at one end of the corresponding signal wiring line 32a. The pads 33a for connecting lead pin are electrically connected to the lead pins 23a included in the CAN package 2. In FIG. 3, a pad 33a-1 for connecting lead pin is provided at one end of the differential signal wiring line 32a-1, and a pad 33a-2 for connecting lead pin is provided at one end of the differential signal wiring line 32a-2.

The pad 33b for connecting lead pin (a second pad for connecting lead pin) is an electrode provided at one end of the wiring line 32b for power supply. The pad 33b for connecting lead pin is electrically connected to the lead pin 23b included in the CAN package 2.

The pads 34a for connecting another board (first pads for connecting another board) are electrodes each provided at the other end of the corresponding signal wiring line 32a. The pads 34a for connecting another board are electrically connected to another printed board (not shown) having a driver IC mounted thereon. In FIG. 3, a pad 34a-1 for connecting another board is provided at the other end of the differential signal wiring line 32a-1, and a pad 34a-2 for connecting another board is provided at the other end of the differential signal wiring line 32a-2.

The pad 34b for connecting another board (a second pad for connecting another board) is an electrode provided at the other end of the wiring line 32b for power supply. The pad 34b for connecting another board is electrically connected to the above-described printed board.

The ground conductor (a first ground conductor) 35a is a solid ground layer which is provided in an internal layer of the board 3 and which is exposed to the outside (front surface side) at one end of the board 3. The one end of the board 3 is an insertion end into the slot 222 of the stem 22. The ground conductor 35a is a conductor used as a reference for the signal wiring lines 32a.

The ground conductor (a second ground conductor) 35b is a solid ground layer which is provided in an internal layer of the board 3 and which is exposed to the outside (back surface side) at the one end of the board 3. The one end of the board 3 is the insertion end into the slot 222 of the stem 22. The ground conductor 35b is a conductor used as a return for the wiring line 32b for power supply.

Figure 4A:
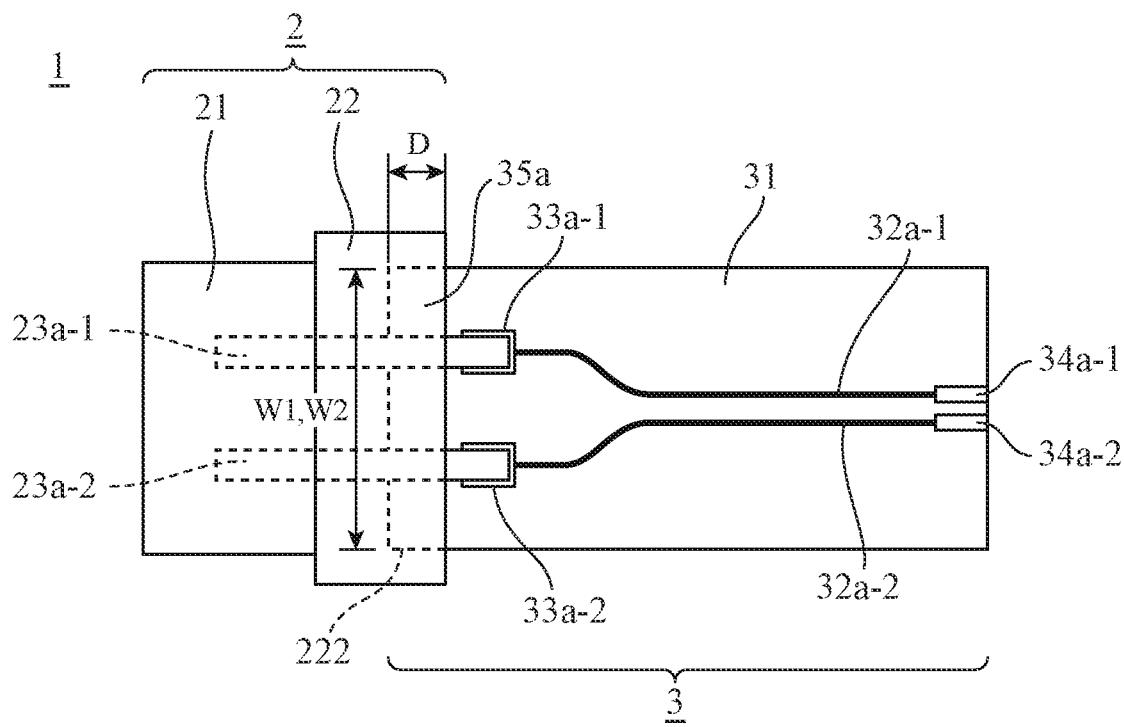
FIGS. 4A and 4B are diagrams showing an exemplary connection between the CAN package and the board according to the first embodiment of the invention.
Figure 4B:
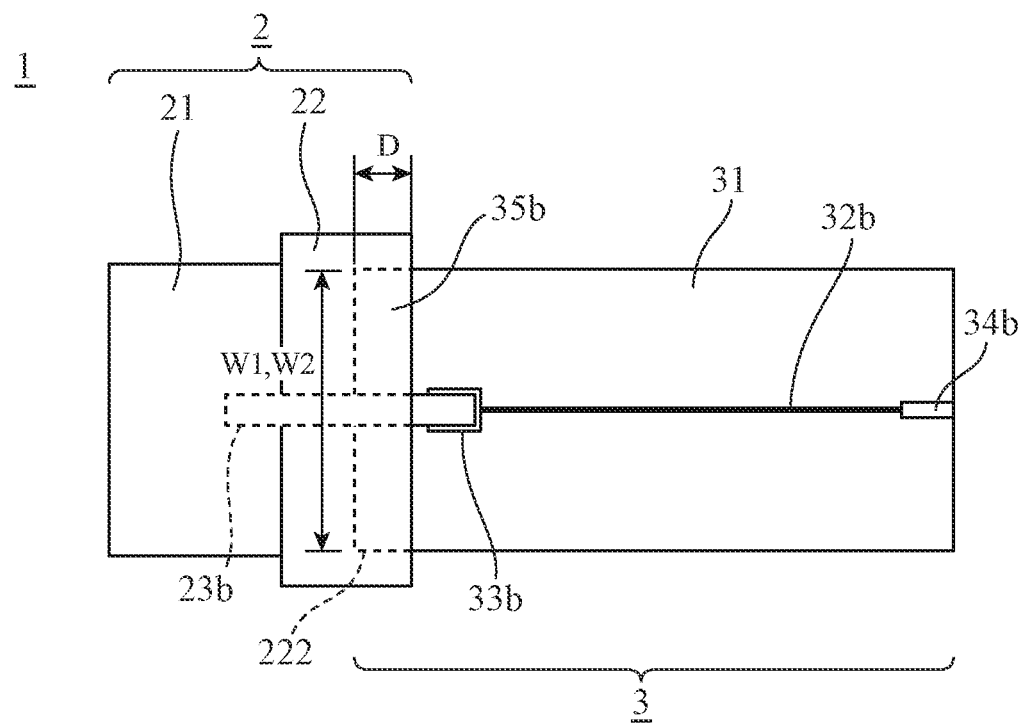

Then, when the CAN package 2 and the board 3 which are configured in the above-described manner are connected, as shown in FIG. 4, a user first inserts the one end (insertion end) of the board 3 into the slot 222 of the stem 22 in parallel (which includes the meaning of substantially parallel) with the lead pins 23a and 23b. Thereafter, the user performs, for example, soldering on a contact portion between the stem 22 and the board 3, by which the board 3 is fixed to the stem 22. Here, the stem 22 also functions as a ground conductor of the CAN package 2, and the ground conductors 35a and 35b are exposed at the one end of the board 3. Thus, the stem 22 and the ground conductors 35a and 35b are electrically connected to each other.

Note that a dimensional relationship between the slot 222 and the one end of the board 3 is formed so as to satisfy at least the following relational inequality (1) or relational inequality (2). In inequalities (1) and (2), T1 is the thickness of the slot 222 and W1 is the width of the slot 222. In addition, T2 is the thickness at the one end of the board 3 and W2 is the width at the one end of the board 3. Note that in the drawings the slot 222 and the board 3 have the same depth (D).

$$T2 \leq T1 \quad (1)$$

$$W2 \leq W1 \quad (2)$$

Then, the user connects the lead pins 23a to the pads 33a for connecting lead pin through conductors 36a and connects the lead pin 23b to the pad 33b for connecting lead pin through a conductor 36b, with the board 3 inserted into the slot 222 in parallel with the lead pins 23a and 23b. In FIG. 1, the lead pin 23a-1 is connected to the pad 33a-1 for connecting lead pin through a conductor 36a-1, thus achieving an electrical connection with the differential signal wiring line 32a-1. In addition, the lead pin 23a-2 is connected to the pad 33a-2 for connecting lead pin through a conductor 36a-2, thus achieving an electrical connection with the differential signal wiring line 32a-2. In addition, the lead pin 23b is connected to the pad 33b for connecting lead pin through the conductor 36b, thus achieving an electrical connection with the wiring line 32b for power supply. The connections by the conductors 36a and 36b may be considered to be solder connections.

Thereafter, the user electrically connects the pads 34a and 34b for connecting another board to the another printed board having the driver IC mounted thereon.

In the optical module 1 configured in the above-described manner, high-speed electrical signals and power are supplied from the printed board having the driver IC mounted thereon to the board included in the lens housing 21 via the board 3.

Figure 14:
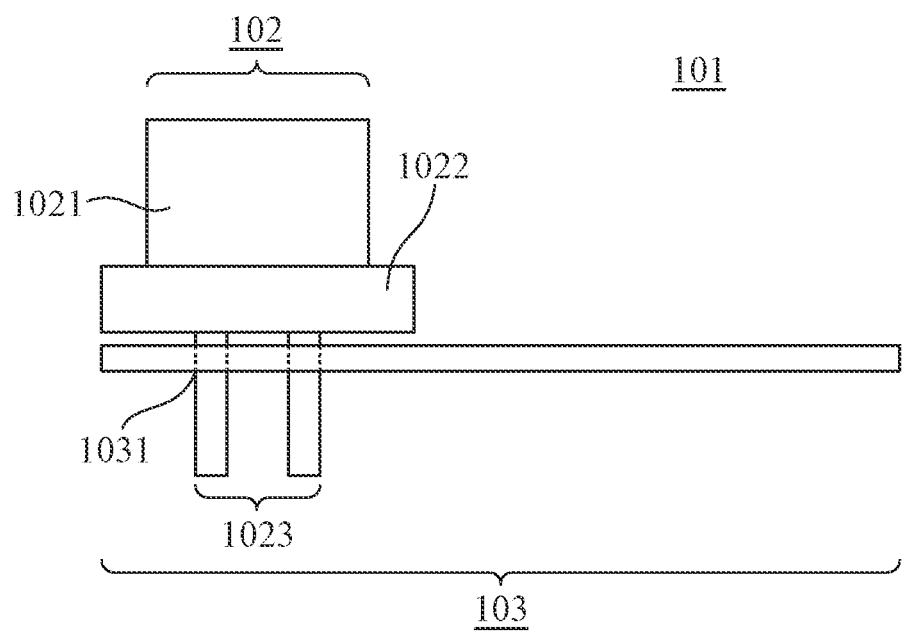
FIG. 14 is a side view showing an exemplary configuration of the conventional optical module.

Here, in the conventional optical module shown in FIG. 14, there is always a remaining portion of a lead pin after cutting off the lead pin, and the remaining portion becomes a stub that degrades high-frequency characteristics. On the other hand, in the optical module 1 according to the first embodiment, since the one end of the board 3 is inserted into the slot 222 of the stem 22 in parallel with the lead pins 23a and 23b, there is no need to cut off the lead pins 23a and 23b, and thus a stub such as that described above does not occur. As a result, high-frequency transmission characteristics can be improved over that of the conventional optical module, and characteristic differences made at a connecting portion between the CAN package 2 and the board 3 depending on the user do not occur.

In addition, in the optical module 1 according to the first embodiment, the one end of the board 3 is inserted into the slot 222 in parallel with the lead pins 23a and 23b. Hence, unlike the conventional optical module, a surface of the stem 22 and a surface of the board 3 do not face each other, and thus parallel plate resonance does not occur.

In addition, by inserting the one end of the board 3 into the slot 222 in parallel with the lead pins 23a and 23b, a reference for high-speed electrical signals is more stabilized.

Figure 5:
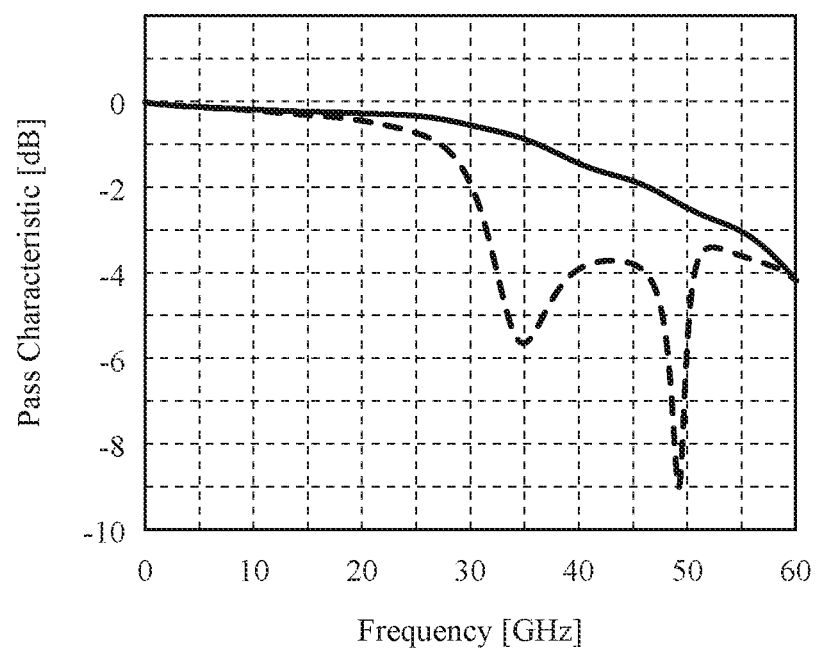
FIG. 5 is a graph showing an example of the pass characteristics of the optical module according to the first embodiment of the invention and a conventional optical module.

An example of the pass characteristics of the optical module 1 according to the first embodiment and the conventional optical module is shown in FIG. 5. In FIG. 5, a solid line indicates the pass characteristic of the optical module 1 according to the first embodiment, and a dashed line indicates the pass characteristic of the conventional optical module.

As shown in this FIG. 5, it can be verified that the optical module 1 according to the first embodiment has no degradation in pass characteristic caused by resonance such as that of the conventional optical module.

In addition, in the optical module 1 according to the first embodiment, the one end of the board 3 is inserted into the slot 222 of the stem 22 in parallel with the lead pins 23a and 23b. Hence, compared to the optical module disclosed in Patent Literature 1, the connection is strong, and thus it is unsusceptible to stress caused by changes in temperature and humidity and mechanical pressure, and thus reliability of a product is high.

Figure 6:
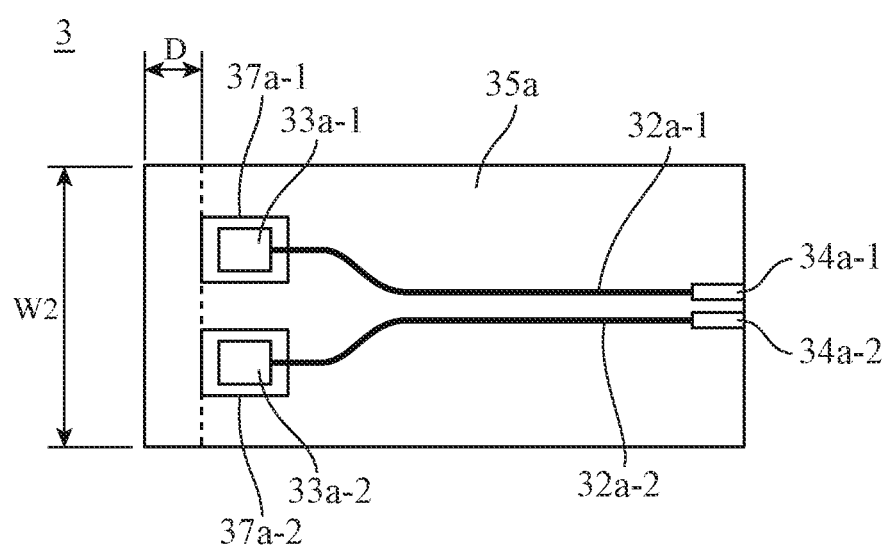
FIG. 6 is a front side view showing another exemplary configuration of the board according to the first embodiment of the invention.

Next, a variant of the optical module 1 according to the first embodiment is shown in FIG. 6. FIG. 6 shows a state in which the front layer of the board 3 is removed in order to show a disposition relationship between the pads 33a for connecting lead pin and the ground conductor 35a.

When the lead pins 23a are electrically connected to the signal wiring lines 32a, parasitic capacitance occurs between the pads 33a for connecting lead pin and the ground conductor 35a serving as a reference. In the case of FIG. 1, parasitic capacitance occurs between the pads 33a-1 and 33a-2 for connecting lead pin and the ground conductor 35a.

Hence, portions of the ground conductor 35a, which is a solid ground layer, present in regions (conductor removal regions 37a) located immediately below the pads 33a for connecting lead pin may be removed. In FIG. 6, portions of the ground conductor 35a present in regions (conductor removal regions 37a-1 and 37a-2) located immediately below the pads 33a-1 and 33a-2 for connecting lead pin are removed. By this, even when the lead pins 23a are electrically connected to the signal wiring lines 32a, variation in characteristic impedance occurring in the pads 33a for connecting lead pin can be suppressed.

Figure 7:
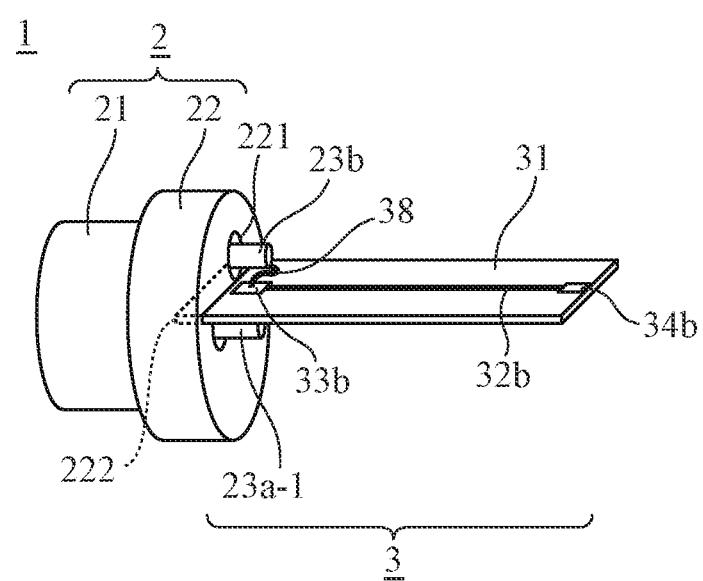
FIG. 7 is a bottom perspective view showing another exemplary configuration of the optical module according to the first embodiment of the invention.

Next, another variant of the optical module 1 according to the first embodiment is shown in FIG. 7.

A positional relationship between the lead pins 23a and 23b and the pads 33a and 33b for connecting lead pin is determined by a positional relationship between the slot 222 provided in the stem 22 and the lead pins 23a and 23b. Hence, depending on the positional relationship between the slot 222 and the lead pins 23a and 23b, there is a possibility that a large gap may be created between the lead pin 23a (23b) and the pad 33a (33b) for connecting lead pin upon inserting the board 3 into the slot 222. Hence, in this case, the lead pin 23a (23b) may be electrically connected to the pad 33a (33b) for connecting lead pin using a jumper wire 38. Note that FIG. 7 shows a case in which the lead pin 23b is electrically connected to the pad 33b for connecting lead pin through the jumper wire 38.

As described above, according to the first embodiment, the CAN package 2 has the slot 222 provided in a surface which is included in the stem 22 and from which the lead pins 23a and 23b protrude, the one end of the board 3 is inserted into the slot 222, and the pads 33a and 33b for connecting lead pin are electrically connected to the lead pins 23a and 23b. Thus, reliability of a product is high, and an impedance mismatch at a connecting portion between the CAN package 2 and the board 3 can be overcome.

In addition, in the optical module 1 according to the first embodiment, since the one end of the board 3 is inserted into the slot 222 of the stem 22 in parallel with the lead pins 23a and 23b, access to the another printed board to which the optical module 1 is to be connected is facilitated. Namely, a flexible board does not need to be connected to the another printed board in a bending manner used in the conventional optical module, and thus the board 3 is not limited to a flexible board.

In addition, in the optical module 1 according to the first embodiment, the stem 22 which functions as a ground conductor of the CAN package 2 is electrically connected to the ground conductors 35a and 35b of the board 3. Thus, a lead pin which is used for a ground in the conventional CAN package can be eliminated from the CAN package 2. As a result, the cost of members and manufacturing cost of the CAN package 2 can be reduced, thus reducing the cost of the optical module 1.

Second Embodiment

The first embodiment shows a case in which after inserting the board 3 into the slot 222, the board 3 is fixed to the CAN package 2 by soldering, etc. On the other hand, a second embodiment shows a case in which the board 3 is fixed to the CAN package 2 by inserting and fitting the board 3 into the slot 222.

Here, a dimensional relationship between the slot 222 and the one end of the board 3 is formed so as to satisfy at least the following relational inequality (3) or relational inequality (4). In inequalities (3) and (4), T1' is the thickness of at least a part of the slot 222, and W1' is the width of at least a part of the slot 222.

$$T1' < T2 \quad (3)$$

$$W1' < W2 \quad (4)$$

Figure 8:
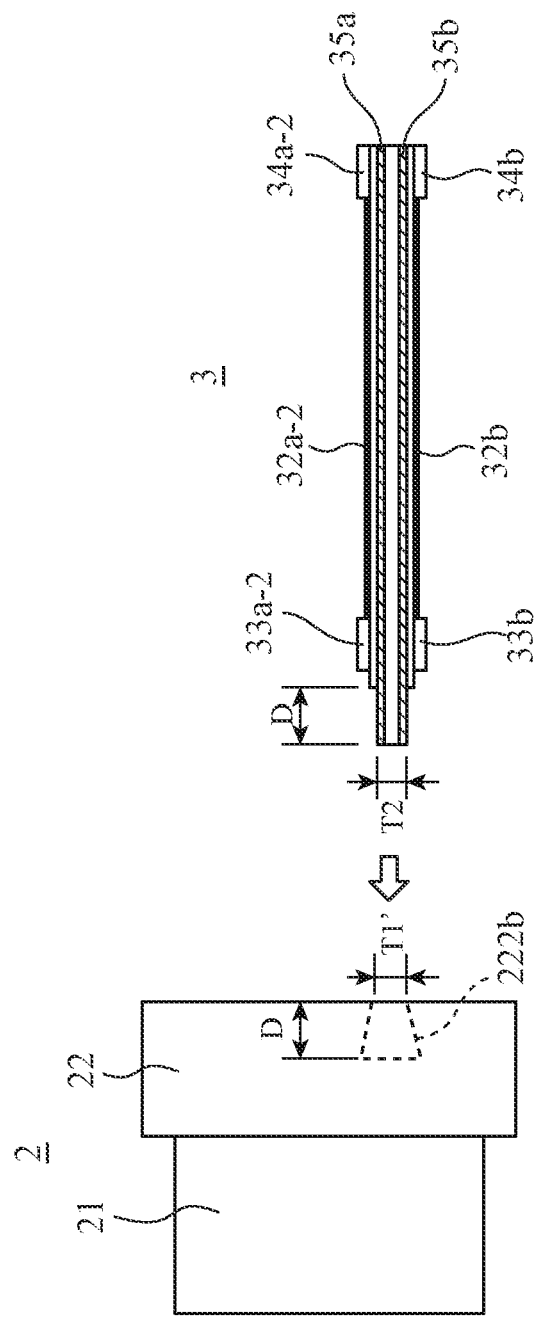
FIG. 8 is a side view showing an exemplary configuration of a CAN package according to a second embodiment of the invention.
Figure 9:
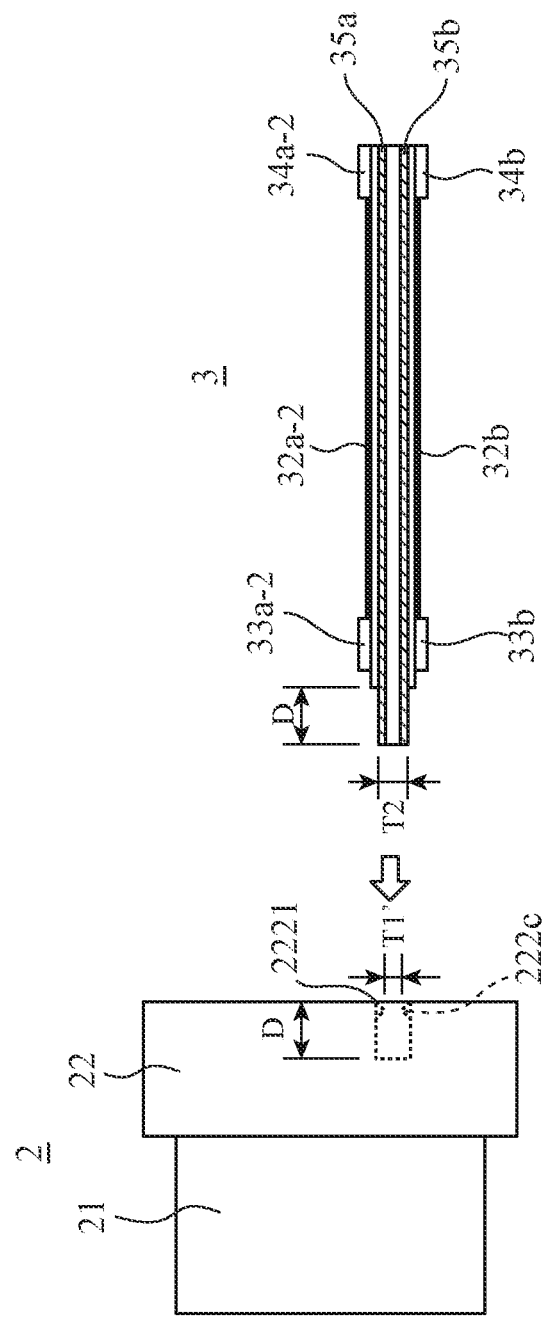
FIG. 9 is a side view showing an exemplary configuration of a CAN package according to the second embodiment of the invention.
Figure 10:
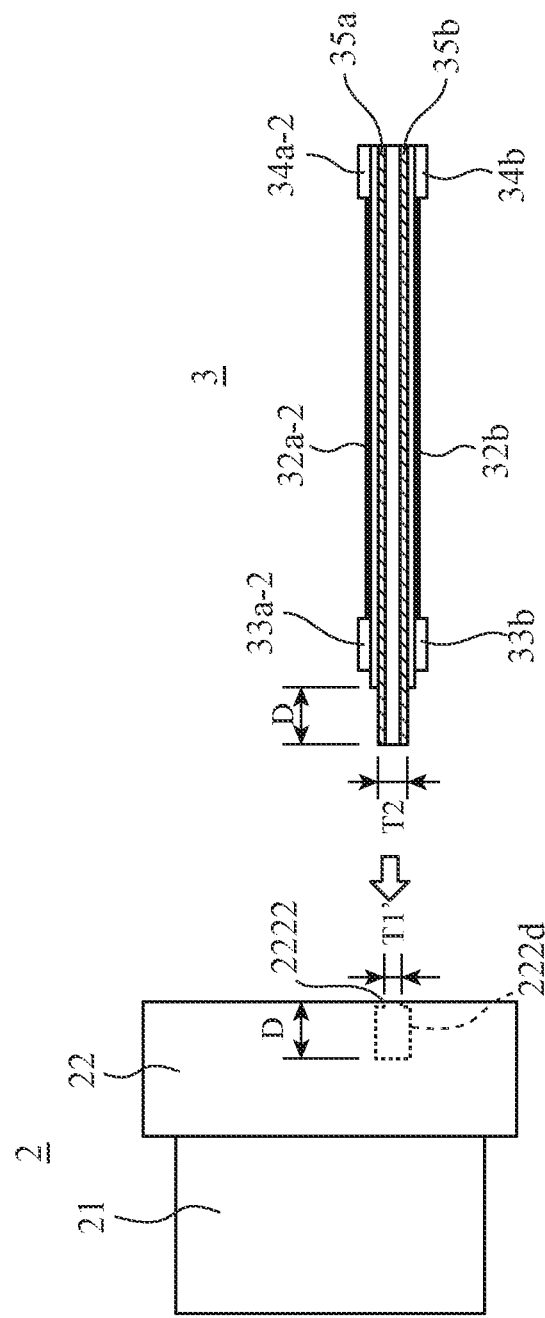
FIG. 10 is a side view showing an exemplary configuration of a CAN package according to the second embodiment of the invention.

By satisfying the inequality (3) or (4), when the board 3 is inserted into the slot 222, the stem 22 clamps the board 3, thus enabling an electrical connection. Specific examples are shown in FIGS. 8 to 10 below. Note that in FIGS. 8 to 10 depiction of the lead pins 23a and 23b and the through-holes 221 is omitted.

In FIG. 8, as the slot 222, the stem 22 is provided with a slot 222b whose side cross-section shape is tapered and whose thickness T1' at an insertion opening is thinner than a thickness T2 at the one end of the board 3. Thus, by inserting the board 3 into the slot 222b of the stem 22, the stem 22 clamps the board 3, thus enabling an electrical connection.

In FIG. 9, as the slot 222, the stem 22 is provided with a slot 222c having projections 2221 at the top and bottom of an insertion opening. A thickness T1' at the insertion opening of the slot 222c, that is, a thickness between the projections 2221, is configured to be thinner than a thickness T2 at the one end of the board 3. Thus, by inserting the board 3 into the slot 222c of the stem 22, the stem 22 clamps the board 3, thus enabling an electrical connection.

In FIG. 10, as the slot 222, the stem 22 is provided with a slot 222d having a narrowed portion 2222 at an insertion opening. A thickness T1' at the insertion opening (the narrowed portion 2222) of the slot 222d is configured to be thinner than a thickness T2 at the one end of the board 3. Thus, by inserting the board 3 into the slot 222d of the stem 22, the stem 22 clamps the board 3, thus enabling an electrical connection.

Note that FIGS. 8 to 10 show a case in which the thickness T1' of at least a part of the slot 222 is made thinner than the thickness T2 at the one end of the board 3. Meanwhile, the same also works for a case in which the width W1' of at least a part of the slot 222 is made narrower than the width W2 at the one end of the board 3.

As described above, according to the second embodiment, the thickness of at least a part of the slot 222 is made thinner than the thickness at the one end of the board 3, or the width of at least a part of the slot 222 is made narrower than the width at the one end of the board 3. Thus, in addition to the advantageous effects of the first embodiment, the stem 22 can be electrically connected to the board 3 without using solder, etc., and thus, mounting processes can be reduced and mounting cost can be reduced.

Third Embodiment

The first embodiment shows a case in which the lead pins 23a are connected to the pads 33a for connecting lead pin through the conductors 36a. On the other hand, a third embodiment shows a case in which the lead pins 23a are connected to the pads 33a for connecting lead pin by direct contact therebetween.

Figure 11:
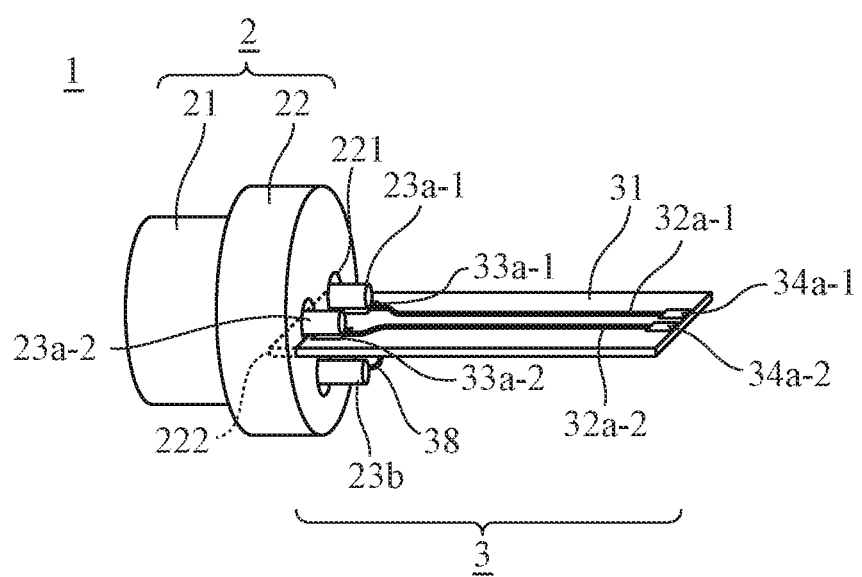
FIG. 11 is a top perspective view showing an exemplary configuration of an optical module according to a third embodiment of the invention.

FIG. 11 is a diagram showing an exemplary configuration of an optical module 1 according to the third embodiment of the invention. The optical module 1 according to the third embodiment which is shown in this FIG. 11 has the slot 222 at a different position and has no conductors 36a as compared with the optical module 1 according to the first embodiment which is shown in FIG. 1. In addition, the jumper wire 38 is used instead of the conductor 36b. Other configurations are the same and denoted by the same reference signs and description thereof is omitted.

Figure 12:
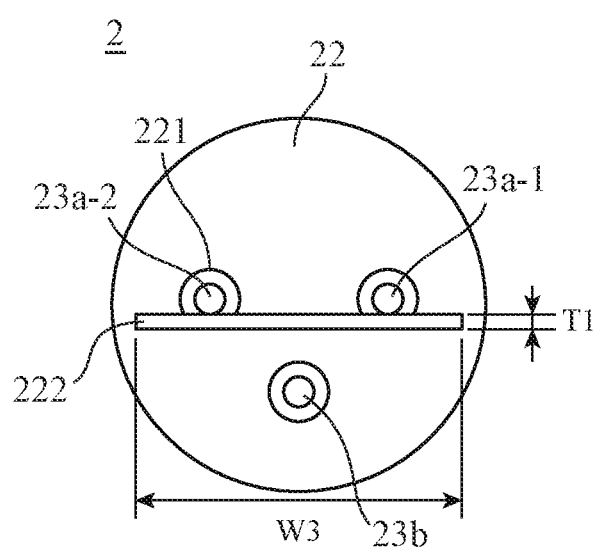
FIG. 12 is a front view showing an exemplary configuration of a CAN package according to the third embodiment of the invention.
Figure 13A:
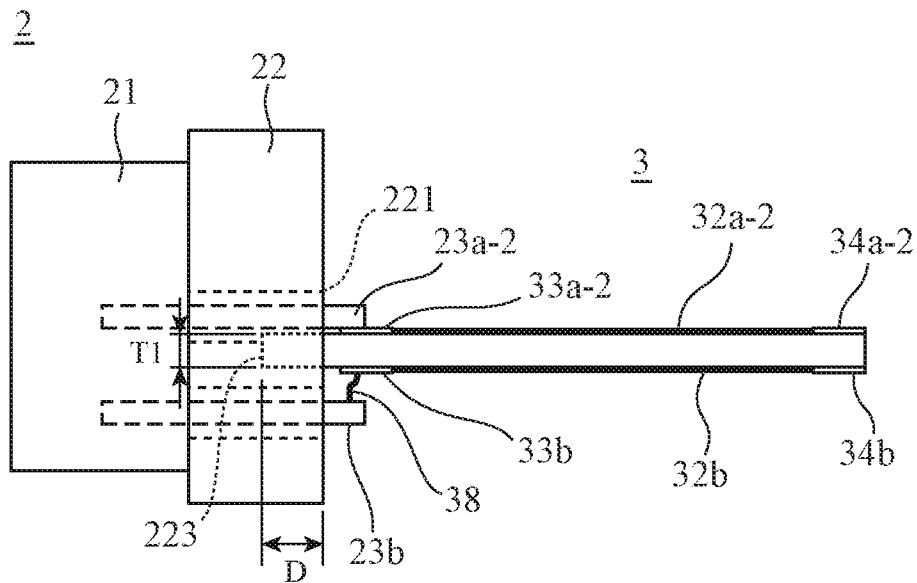
FIGS. 13A and 13B are diagrams showing an exemplary connection between the CAN package and a board according to the third embodiment of the invention.
Figure 13B:
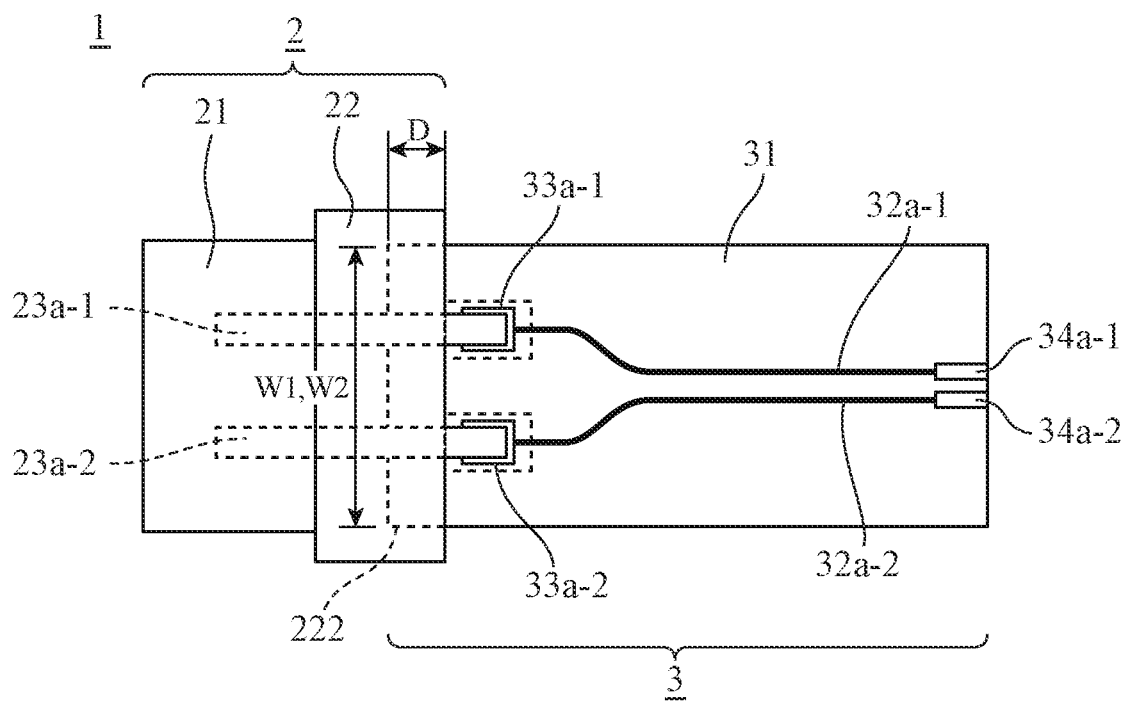

The slot 222 is offset toward the side of the lead pins 23a, i.e., provided near the lead pins 23a. In FIG. 12, the slot 222 is provided near the lead pins 23a-1 and 23a-2.

By this, when the one end of the board 3 is inserted into the slot 222 in parallel with the lead pins 23a and 23b, the lead pins 23a directly contact the pads 33a for connecting lead pin. By this, the lead pins 23a can be electrically connected to the pads 33a for connecting lead pin without using the conductors 36a. As a result, variation in characteristic impedance occurring when the lead pins 23a are electrically connected to the pads 33a for connecting lead pin using the conductors 36a can be suppressed, and degradation in high-frequency characteristics can be suppressed.

Note that the above description shows a case in which the position of the slot 222 is offset toward the side of the lead pins 23a in the configuration of the first embodiment. However, no limitation thereto is intended, and the position of the slot 222 may be offset toward the side of the lead pins 23a in the configuration of the second embodiment.

Note that in the invention of the present application, a free combination of the embodiments, modifications to any component of the embodiments, or omissions of any component in the embodiments are possible within the scope of the invention.

INDUSTRIAL APPLICABILITY

An optical module according to the invention has high reliability of a product and can overcome an impedance mismatch at a connecting portion between a CAN package and a board. Thus, the optical module according to the invention is suitable for use as, for example, an optical module including a CAN package having a stem and a lead pin; and a board having an electrode connected to the lead pin.

REFERENCE SIGNS LIST

1: Optical module, 2: CAN package, 3: Board, 21: Lens housing, 22: Stem, 23a, 23a-1, and 23a-2: Lead pin, 23b: Lead pin, 31: Resin, 32a: Signal wiring line, 32a-1 and 32a-2: Differential signal wiring line, 32b: Wiring line for power supply, 33a, 33a-1, 33a-2, and 33b: Pad for connecting lead pin, 34a, 34a-1, 34a-2, and 34b: Pad for connecting another board, 35a and 35b: Ground conductor, 36a, 36a-1, 36a-2, and 36b: Conductor, 37a, 37a-1, and 37a-2: Conductor removal region, 38: Jumper wire, 221: Through-hole, 222 and 222b to 222d: Slot, 2221: Projection, and 2222: Narrowed portion.

The invention claimed is:

1. An optical module comprising:
   a CAN package having a stem and a lead pin protruded from the stem; and
   a board having an electrode, wherein
   the CAN package has a slot provided in a surface of the stem, the lead pin being protruded from the surface, and the slot being provided in the surface except for a part from which the lead pin protrudes,
   one end of the board is inserted into the slot, and the electrode is electrically connected to the lead pin,
   the stem also functions as a ground conductor, and
   the board has a ground conductor exposed to outside at the one end and electrically connected to the stem, the ground conductor forming an internal layer that extends longitudinally within the board.

2. The optical module according to claim 1, wherein the board is inserted into the slot in parallel with the lead pin.

3. The optical module according to claim 1, wherein a thickness of at least a part of the slot is thinner than a thickness at the one end of the board.

4. The optical module according to claim 1, wherein a width of at least a part of the slot is narrower than a width at the one end of the board.

5. The optical module according to claim 1, wherein
   the lead pin includes a first lead pin for transmitting an electrical signal, and
   the electrode directly contacts the first lead pin.

* * * * *